United States Patent
Beintner

(10) Patent No.: US 6,677,205 B2
(45) Date of Patent: Jan. 13, 2004

(54) INTEGRATED SPACER FOR GATE/SOURCE/DRAIN ISOLATION IN A VERTICAL ARRAY STRUCTURE

(75) Inventor: Jochen Beintner, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/966,644

(22) Filed: Sep. 28, 2001

(65) Prior Publication Data

US 2003/0062568 A1 Apr. 3, 2003

(51) Int. Cl.[7] ............................................. H01L 21/336
(52) U.S. Cl. ....................... 438/270; 438/270; 438/272; 438/589
(58) Field of Search ................................. 438/270, 272, 438/589

(56) References Cited

U.S. PATENT DOCUMENTS

| | | | | |
|---|---|---|---|---|
| 4,847,214 A | * | 7/1989 | Robb et al. | 438/430 |
| 5,208,172 A | * | 5/1993 | Fitch et al. | 438/272 |
| 5,801,089 A | * | 9/1998 | Kenney | 438/589 |
| 5,998,288 A | * | 12/1999 | Gardner et al. | 438/589 |

* cited by examiner

Primary Examiner—George Fourson
Assistant Examiner—Julio J. Maldonado
(74) Attorney, Agent, or Firm—Slater & Matsil, LLP

(57) ABSTRACT

Alignment tolerance for a vertical gate transistor device can be relaxed because of a spacer formed adjacent the trench. The gate electrode is formed of two materials that have etch selectivity between them, such that the outer material can be etched a predetermined depth into the recess without etching the inner material, resulting in the formation of a divot at the top of the trench. The divot is filled with an insulating material so that if source drain contacts are misaligned, the spacer serves to insulate the gate electrode from the contacts.

15 Claims, 4 Drawing Sheets

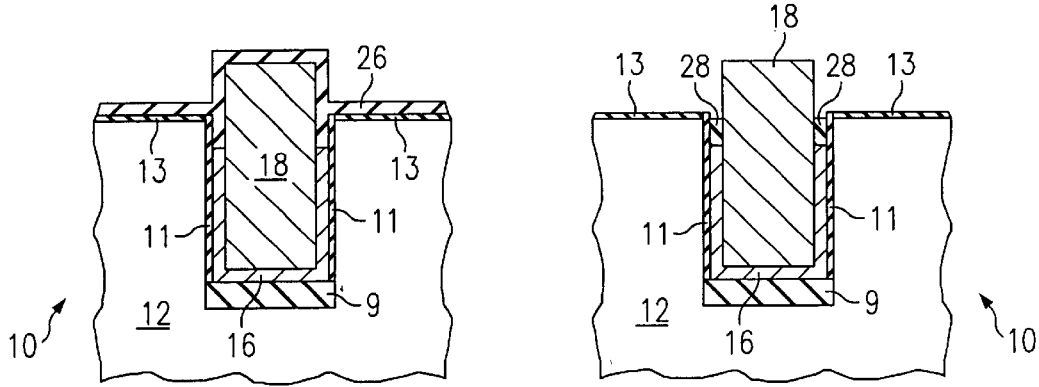
FIG. 2G
FIG. 2H
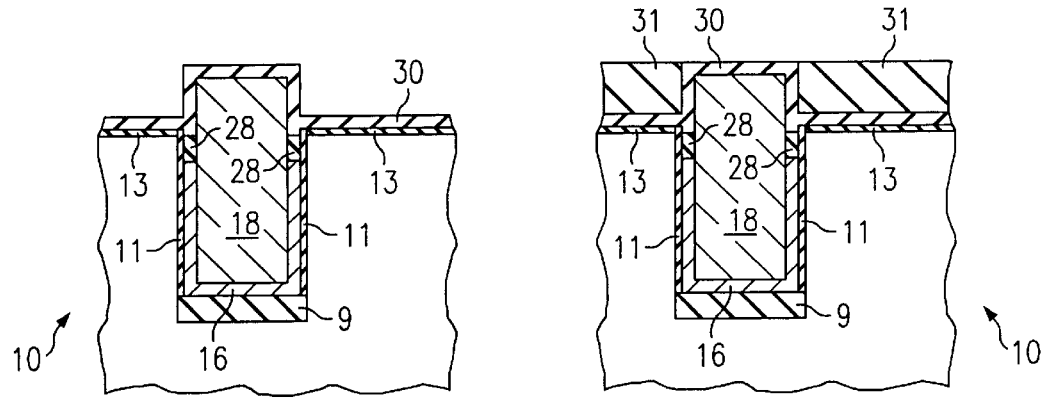
FIG. 3A
FIG. 3B
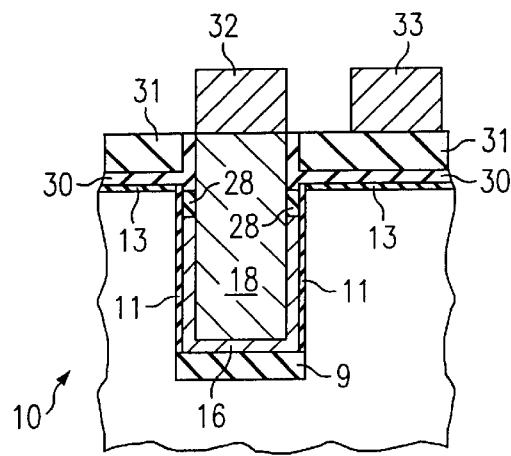
FIG. 3C

INTEGRATED SPACER FOR GATE/SOURCE/ DRAIN ISOLATION IN A VERTICAL ARRAY STRUCTURE

TECHNICAL FIELD OF THE INVENTION

The present invention relates generally to semiconductor fabrication and, more particularly to the formation of an integrated spacer for gate, source, and drain isolation in a vertical device semiconductor structure.

BACKGROUND OF THE INVENTION

Integrated circuit fabrication involves creating features into a substrate, generally silicon, which results in various devices such as transistors and capacitors. The fabrication of transistors and capacitors are of particular importance in memory devices that use transistors to transfer charge and capacitors to store charge. Designers, however, are increasingly faced with shrinking circuit sizes. These shrinking sizes result in challenges in designing integrated circuits that require large capacitor size, which takes up a larger area on the circuit and is in conflict with shrinking circuit sizes. Dynamic Random Access Memory (DRAM) devices, in particular, suffer from the aforementioned problem.

Another problem in DRAM design involves the increase in leakage current as transistor devices become smaller. To resolve this problem, deep trench transistors and capacitors are utilized to reduce the amount of substrate surface that is needed to produce a device. Isolation of these devices, however, requires the formation of elements that require extra lithographic steps and thus increases costs. What is needed, therefore, is a memory cell design that provides for good isolation of source and drain contacts from the vertical gate that does not excessively increase the device size.

SUMMARY OF THE INVENTION

These above-described and other problems are generally solved or circumvented, and technical advantages are generally achieved, by the present invention.

In a first aspect the present invention provides for a method for forming a spacer in a semiconductor device having a trench for formation of a gate electrode. The device comprises a pad oxide formed adjacent to each side of the trench, and a pad nitride on top of the pad oxide. The method includes depositing a first conductive material onto a gate oxide layer formed within the trench and atop the pad nitride, depositing a second conductive material atop the first conductive material, planarizing the conductive material and the gate electrode layer to a level coplanar with the pad nitride, and removing the pad nitride. The method further includes etching the first conductive material to a predetermined depth within the trench to form a divot, and forming an integrated spacer within the divot.

In another aspect, the present invention provides for a method of forming a memory device having a vertical array transistor whereby a gate electrode is formed within a trench, the device comprising a pad oxide formed adjacent the trench, and having a pad nitride on top of the pad oxide. The method comprises depositing a first conductive material onto a gate oxide layer formed within the trench and atop the pad nitride, depositing a second conductive material having selective etch properties relative the first conductive material onto the first conductive material, the first and second conductive material forming a gate electrode, planarizing the first and second conductive material to a level coplanar with a top surface of the pad nitride, and removing the pad nitride. The method further comprises etching the first conductive material to a predetermined depth within the trench to form a divot, and depositing a liner layer within the divot, whereby a spacer is formed within the divot. The method further includes depositing a second liner layer, depositing an array top oxide on top of the second liner layer, planarizing the array top oxide to a level coplanar to the top of the second liner layer, removing the second liner layer from atop the gate electrode, forming gate conductors atop the gate electrode and the array top oxide, and forming sidewall spacers at each side of the gate conductors.

In other aspects, the present invention provides for integrated circuits and devices formed using the above-described methods.

An advantage of the preferred embodiments of the present invention is that source and drain contacts can be isolated from the vertical gate and the amount of substrate surface needed to produce a device can often be decreased.

Another advantage of the preferred embodiments of the present invention is that an integrated spacer is provided for a vertical array structure, which does not require extra lithographic steps.

A further advantage of a preferred embodiment of the present invention is that a control mechanism is provided that improves control over the etching of divots in the periphery of the gate electrode.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the concepts and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The above features of the present invention will be more clearly understood from consideration of the following descriptions in connection with accompanying drawings in which:

FIGS. 2A–2H illustrate a preferred method of forming a preferred embodiment structure of the present invention; and FIGS. 3A–3E illustrate a preferred method of processing a DRAM with a vertical array transistor.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Figure 1A:
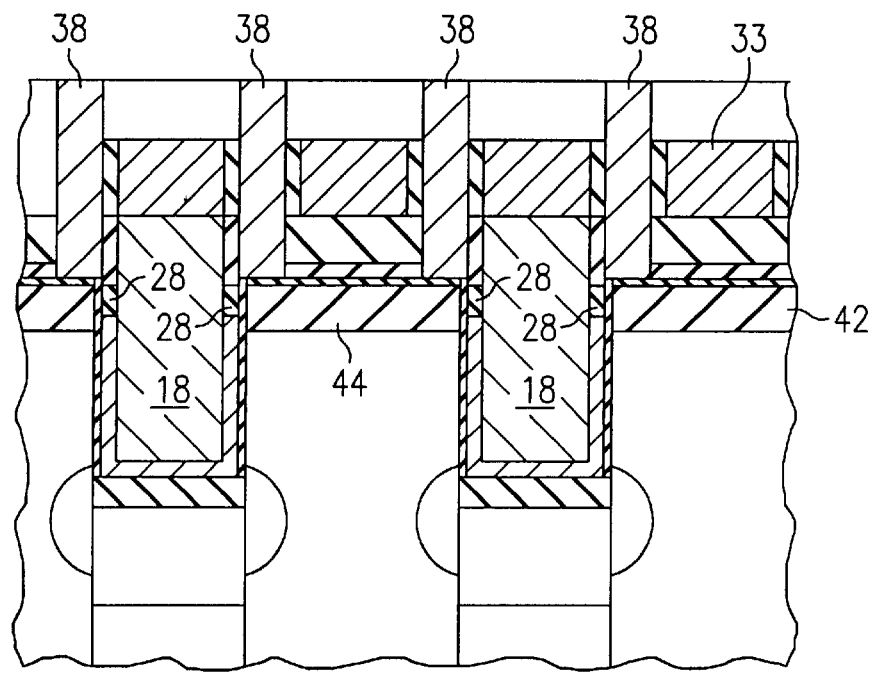
FIGS. 1a and 1b illustrate in cross section an aligned vertical gate transistors and a misaligned vertical gate transistor, respectively, showing the advantageous features of preferred embodiments of the present invention.

The making and using of the presently preferred embodiment is discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Although the present invention will be discussed in the context of memory devices, and particularly DRAM applications, it should be appreciated by those skilled in the art that the present invention may be utilized in other applications.

FIGS. 2A–2H illustrate a preferred embodiment method of the present invention for forming a vertical structure having an integrated spacer. The structure 10 includes a substrate 12 in which is formed a trench 14 for formation of a gate electrode and includes a gate oxide 11 formed on the sidewalls of the trench and a pad oxide 13 formed adjacent each side of the trench 14. The trench preferably includes a top portion defining a vertical gate transistor and a bottom portion (not shown) defining a capacitor. A trench top oxide 9 defines the bottom most portion of the vertical gate transistor region of the trench and separates (electrically isolates) the vertical gate from the underlying capacitor. The structure 10 further includes a pad nitride 15 on top of the pad oxide 13. The pad oxide 13 serves as a barrier layer between the substrate 12 and the pad nitride 15 to buffer stress mismatch between pad nitride 15 and substrate 12 in later processing steps. The pad nitride 15 serves primarily as a chemical mechanical polish ("CMP") etch stop in subsequent steps as described below. In some embodiments, pad nitride 15 can also serve as a diffusion barrier in subsequent steps.

Figure 2A:
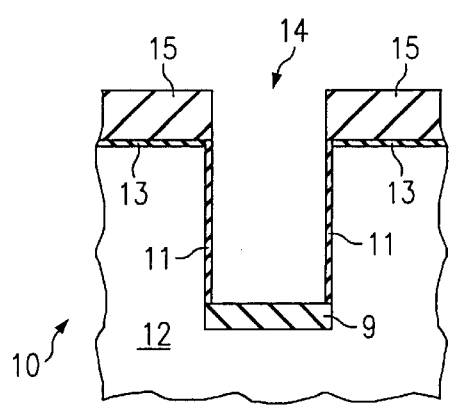
Figure 2B:
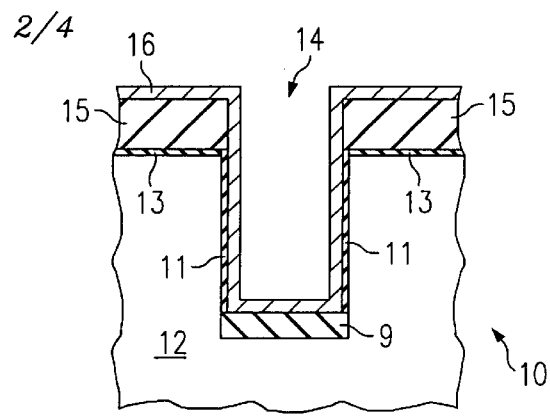

The preferred embodiment method comprises depositing a first conductive material 16, preferably comprising polysilicon, onto a gate oxide layer 11 formed within the trench 14 and also atop the pad nitride 15. This is illustrated in FIG. 2B. The conductive material 16 is preferably deposited to a thickness of about 200 to about 1000 angstroms, preferably using a chemical vapor deposition (CVD) technique, although other deposition techniques such as plasma enhanced chemical vapor deposition (PECVD) or physical vapor deposition (PVD) could be used. Alternatively, conductive material 16 could be formed of a tungsten-silicon alloy, or tungsten, or tantalum, or other well-known conductive materials used in semiconductor fabrication processes, provided the material chosen provides the desired selective etch response compared to the second conductive material 18 described below.

Figure 2C:
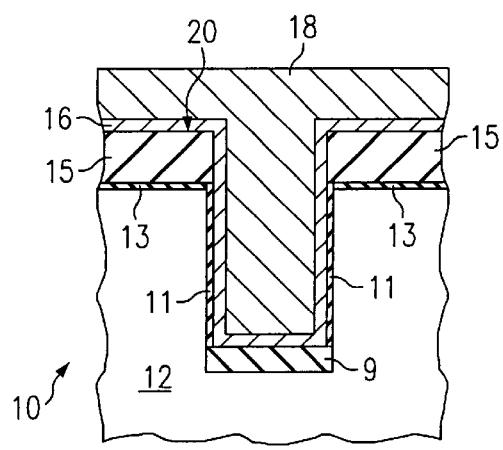

As shown in FIG. 2C, a second conductive material 18 is formed atop the first conductive material and fills in the remainder of trench 14. This second conductive material 18 is preferably formed of a polysilicon-germanium alloy, preferably in the range of 60% to 90% silicon and more preferably around 70% silicon to 30% germanium. An advantageous feature of polysilicon-germanium is that is has selective etch properties relative polysilicon using, e.g. $NH_4OH$. This feature allows for the formation of spacer divots in the polysilicon layer 16, as will be explained in greater detail below. Polysilicon-germanium in combination with polysilicon has been evaluated as a gate conductor (GC) for P- and N-type MOS transistors in the prior art and found to be equivalent or better in terms of low germanium content (<45%). For P-doped polysilicon-germanium, a significant decrease (up to ~0.4 Volts) of the work function has been observed. For n-doped polysilicon-germanium, the work function decreases only slightly.

In alternative embodiments, the order of the polysilicon layer and poly-silicon-germanium layer can be switched. In other words, first conductive layer 16 can be formed from polysilicon-germanium and second conductive layer 18 formed from polysilicon. While such embodiments provide the desired selective etch properties between the two layers, experimentation has revealed a more satisfactory structure using polysilicon as the first layer and polysilicon-germanium as the second.

Figure 2D:
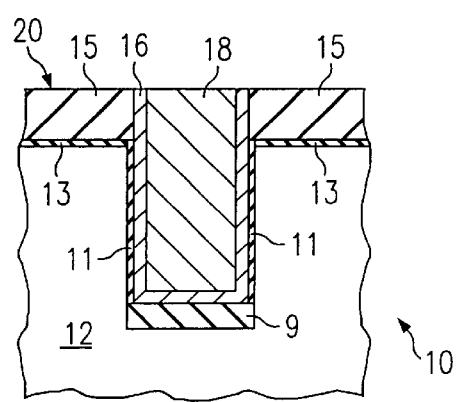
Figure 2E:
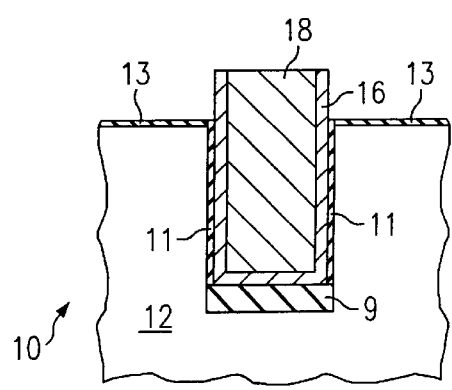
Figure 2F:
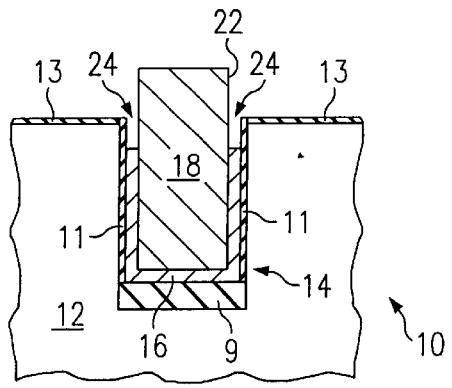

As illustrated in FIG. 2D, the first and second conductive material 16 and 18, respectively, are planarized to a level that is coplanar to a top surface 20 of the pad nitride. The planarization may be accomplished by reactive ion etching (RIE), but is preferably accomplished through a chemical mechanical polish (CMP) process. FIG. 2E illustrates the device after the next step of stripping away the pad nitride 15 has been performed, typically using a wet etch, such as hot phosphoric acid, or a selective plasma etch. At this point in the process the remaining conductive material 16 at each side of a top portion 22 of the polysilicon gate electrode is selectively etched to a predetermined depth within the trench 14 to form a divot. Preferably, the divots are formed to a depth of 200 to 800 angstroms. More preferably, the divots are formed to a depth of around 500 angstroms. By selective etch it is meant that the conductive material 16 is etched away, but the gate electrode material 18 is not substantially removed by this etch step. This selective etching results in the structure a shown in FIG. 2F. For the preferred embodiment in which the conductive material 16 is polysilicon and the second conductive material 18 is polysilicon-germanium, $NH_4OH$ provides the desired etch properties that are selective to the silicon-germanium. One skilled in the art will recognize that other selective etchants can be substituted as a matter of design choice and routine experimentation. The process can be either a dry or wet etch selective to silicon-germanium and preferably an intrinsic plasma etch. The selective etch step leaves a divot 24 at the periphery of the gate electrode (comprised of first and second conductive layers 16 and 18) that is preferably about 500 angstroms. Preferably, a thin oxide layer, in the range of 30 to 50 Angstroms, is grown after the selective etch step and prior to depositing the nitride fill layer 26 discussed below. Although not shown in the drawings, this thin oxide layer acts to protect the underlying regions when the nitride layer is removed.

As illustrated in FIG. 2G, a liner layer 26 is deposited onto the pad oxide, the etched back conductive material 16, and atop the polysilicon gate electrode 18 to result in the filling of the divot 24 formed in the prior step. The liner layer 26 is then completely etched away from the pad oxide and the top of the polysilicon gate electrode 18 while etching the portion of the liner layer 26 atop the etched back conductive material 16. In some embodiments, the liner layer 26 is etched back to a level coplanar to the top of pad oxide 13, although this is not always the case. The etching can be performed utilizing RIE, wet etch, or some other dry etch technique. The liner layer 26 is preferably comprised of silicon nitride. The resulting structure, having a spacer 28 formed from the liner layer remaining in the divot 24 between the gate oxide and polysilicon gate electrode 18 is illustrated in FIG. 2H. Also by forming the spacer 28 after stripping the pad nitride 15, additional silicon nitride refill steps are avoided. Silicon nitride refill steps can be required, however, if the stripping of the pad nitride inadvertently strips away some of the nitride spacer, thus, increasing costs.

In another preferred embodiment method of the present invention, the etching of the first conductive material 16 to a predetermined depth within the trench 14 is performed after the planarizing of the conductive material 16 and the deposition of the second conductive material, but before the stripping of the pad nitride 15. This order of steps involves fewer process steps between the deposition of the conductive layers 16, 18 and the selective etch of those layers, in which steps the silicon-germanium and polysilicon layers could intermix, which intermixing would lessen the selectivity of the subsequent selective etch step.

Figure 3D:
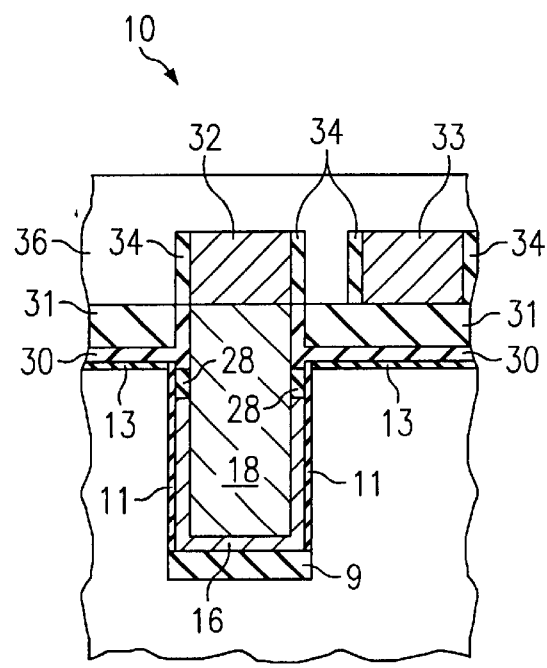
Figure 3E:
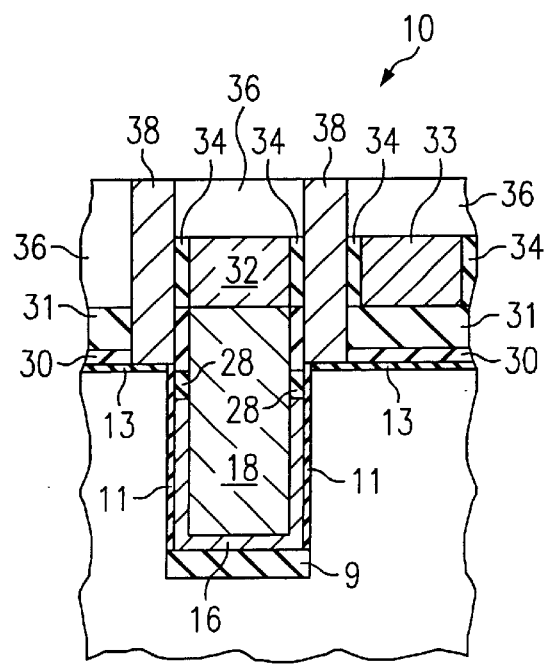

FIGS. 3A–3E illustrate a preferred method of processing a DRAM with a vertical array transistor. The processing of the DRAM with a vertical array transistor begins with the formation of well implants and array contact implants after the last step of the spacer formation as described above and illustrated in FIG. 2H. FIG. 3A illustrates the deposition of a second liner layer 30 on top of the pad oxide 13, the conductive material 16 and the spacers 28. The second liner layer 30 is preferably comprised of silicon nitride. The second liner layer 30 is deposited to a thickness of about 100 to 300 Angstroms. An array top oxide (ATO) 31 is deposited on top of the second liner layer 30. This oxide layer is formed in the active area array and isolates the passing word lines from the underlying regions. The ATO is then planarized to a level coplanar to the top of the second liner layer 30 by a CMP process, resulting in an ATO thickness in the range of 200 to 600 Angstroms after processing, as shown in FIG. 3b.

After depositing the silicon nitride liner 30/ATO 31 stack and structuring this stack so that it only remains in the array, support processing is performed by performing an oxide deglaze (e.g., a short BHF wet etch) and stripping the second liner layer 30. This facilitates the integration of the diffusion area by implantation, gate oxidation and the deposition of polysilicon as the first part of the gate electrode stack in the support area. This polysilicon layer gets removed, together with the nitride liner 30 on top of the vertical gate conductor, in the array by a dry etch followed by a wet clean of the vertical gate contact. This facilitates the integration of the gate electrode with the gate conductors 32 that are comprised of Wsi, polysilicon/Wsi, polysilicon/WN/W or Wn/W, or other suitable gate conductor material. One of the conductors 32 is positioned atop the polysilicon gate electrode 18 and represents an active word line in the memory cell. Another of the conductors 33 is positioned atop the ATO located to the right of the polysilicon gate electrode 18 and represents a passive word line in the memory cell. This is illustrated in FIG. 3C.

The oxidation of the sidewalls of the gate conductors 32 and 33 is followed by the deposition and RIE of a silicon nitride liner to form sidewall spacers 34 (the oxidation will result in a sidewall oxide if polysilicon or WSi is oxidized, whereas a selective oxidation is employed in the case of W/WN conductors that only oxides polysilicon, if any). The sidewall spacers 34 are preferably comprised of silicon nitride but may be comprised of deposited silicon oxide, as well. After the sidewall spacers are formed, source and/or drain implants are formed, as is known in the art.

Before further processing is performed an interlayer dielectric, referred to as a "middle of line" ("MOL") oxide 36 is deposited atop the ATO and the gate conductors 32 and planarized. Contacts 38 are formed to contact the source and/or drain implant regions by lithographically forming contact trenches within the MOL oxide 36 to a depth that results in the contacts 38 being positioned atop the active area silicon. These trenches are then filled with polysilicon, tungsten, tungsten silicide, or other appropriate conductor to form the contacts 38. One skilled in the art will recognize that, prior to filling the contact holes to form contacts 38, a contact implant is performed, the purpose of which is to provide low contact resistance.

Figure 1B:
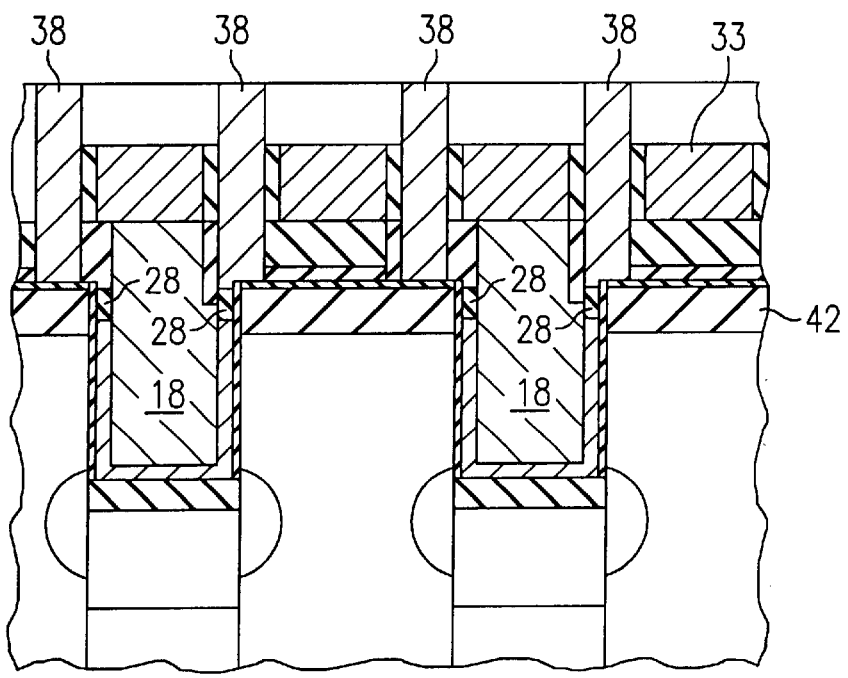

FIG. 1a illustrates a vertical trench device having good alignment of the features. Contacts 38 are properly aligned and contact doped regions 42 (which comprise either the source or the drain region for the vertical gate transistor). Note that contacts 38 do not overlap with or contact drain electrode 16, 18 in any way. Gate electrode sidewall spacers 130, together with second nitride liner 30, isolate the electrode from the contacts above the surface of the implant regions 42 and because of the alignment, the contacts 38 would not contact the gate electrode below the surface of the implant regions even without the integrated spacers 28. In FIG. 1b, by contrast, the contacts 38 have been misaligned and encroach into the region of gate electrode 18. The presence of spacer 28, such as a nitride spacer, formed in the divot 24 electrically isolates the gate electrode 16, 18 from the contacts 38, even though the contacts would otherwise encroach within the trench region. This advantageous feature allows for less alignment critically in the resulting product.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, manufacture, composition of matter, means, methods and steps described in the specification. As one of ordinary skill in the art will readily appreciate from the disclosure of the present invention, processes, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, manufacture, compositions of matter, means, methods, or steps.

What is claimed is:

1. A method for forming a spacer in a semiconductor device having a trench for formation of a gate electrode, the device comprising a pad oxide formed adjacent the trench, and a pad nitride on top of the pad oxide, the method comprising:
   depositing a first conductive material onto a gate oxide layer formed within the trench and atop the pad nitride;
   depositing a second conductive material atop the first conductive material;
   planarizing the first and second conductive material to a level coplanar with the pad nitride;
   removing the pad nitride;
   selectively etching the first conductive material to a predetermined depth within the trench to form a divot; and
   forming an integrated spacer within the divot.

2. The method as in claim 1 wherein the trench is formed within a silicon substrate.

3. The method as in claim 1 wherein the first conductive material is comprised of polysilicon.

4. The method as in claim 1 wherein the first conductive material comprises polysilicon-germanium.

5. The method as in claim 1 wherein the first conductive material has a thickness of about 200 to about 1000 angstroms.

6. The method as in claim 1 wherein the step of depositing the first and second conductive material and liner layer comprises chemical vapor deposition.

7. The method as in claim 1 wherein the step of planarizing the pad nitride comprises chemical mechanical polishing.

8. The method as in claim 1 wherein the step of planarizing comprises chemical mechanical polishing.

9. The method as in claim 1 wherein the step of etching the first conductive material is accomplished by a process chosen from the group consisting of reactive ion etching, wet etch, and plasma etch.

10. The method as in claim 1 wherein the etching back of the liner layer is accomplished by a process chosen from the group consisting of reactive ion etching, wet etch, and plasma etch.

11. The method as in claim 10 wherein the wet etch utilizes $NH_4OH$.

12. The method as in claim 1 wherein the first conductive material is about 600 angstroms thick.

13. The method as in claim 1 wherein the first conductive material comprises tungsten or a tungsten alloy.

14. The method as in claim 1 wherein the step of etching the first conductive material to a predetermined depth within the trench is performed after the step of planarizing the first and second conductive material and before the step of removing the pad nitride.

15. The method as in claim 1 wherein the semiconductor device is a Dynamic Random Access Memory device.

* * * * *